United States Patent [19]

Schild et al.

[11] Patent Number: 4,740,848
[45] Date of Patent: Apr. 26, 1988

[54] VCR WITH SIMPLIFIED HEAD SHIELDING

[75] Inventors: Josef Schild; Johannes Schramel, both of Vienna, Austria

[73] Assignee: U.S. Philips Corp., New York, N.Y.

[21] Appl. No.: 88,008

[22] Filed: Aug. 18, 1987

Related U.S. Application Data

[63] Continuation of Ser. No. 884,701, Jul. 11, 1986, abandoned.

[30] Foreign Application Priority Data

Jul. 15, 1985 [AT] Austria .................................. 2090/85

[51] Int. Cl.[4] .......................... G11B 5/52; G11B 5/11; G11B 21/04
[52] U.S. Cl. ..................................... 360/84; 360/107; 360/128
[58] Field of Search ................. 360/84, 107, 108, 128, 360/129, 130.24

[56] References Cited

U.S. PATENT DOCUMENTS 4,031,558 6/1977 Kusaka ................................ 360/108
4,654,738 3/1987 Kato et al. ..................... 360/130.24

OTHER PUBLICATIONS

Dent, "Cancellation ... Heads", IBM Tech. Disc. Bull., vol. 18, No. 1, Jun. 1975, p. 31.

Primary Examiner—Robert S. Tupper
Attorney, Agent, or Firm—David R. Treacy

[57] ABSTRACT

In a recording and/or reproducing apparatus for a magnetizable tape, such as a VCR, having a cylindrical scanning unit about which a length of tape can be wrapped, electromagnetic shielding is provided by a shielding enclosure for the scanning unit and a shielding box for an amplifier connected to the unit by a shielded cable. The shielding box and the shielding enclosure share a common wall portion arranged between the scanning unit and the amplifier. The common wall portion is preferably arranged perpendicular to the cylindrical scanning unit axis, and has an end of the scanning unit shaft passing through an opening for engagement by a leaf spring connected to the common wall portion.

19 Claims, 1 Drawing Sheet

VCR WITH SIMPLIFIED HEAD SHIELDING

This is a continuation of application Ser. No. 884,701, filed July 11, 1986, now abandoned.

BACKGROUND OF THE INVENTION

The invention relates to a recording and/or reproducing apparatus for a magnetisable record carrier in the form of a tape which can be wrapped along a helical path over at least a part of the circumferential surface of a cylindrical scanning unit arranged on an electrically conductive chassis, hereinafter referred to as a VCR although the invention is not limited to apparatus handing video information or using a cassette. More particularly, the invention relates to a VCR which comprises at least one rotatable magnetic head which cooperates with an amplifier via a shielded cable. The amplifier is accomodated in an electrically conductive shielding box comprising a bottom section and a cover section. The scanning unit is surrounded by an electromagnetic shield formed by the chassis and electrically conductive walls.

The magnetic head and the amplifier, as well as the cable extending between them, are very sensitive to spurious radiation in the form of electromagnetic fields because in this electrical part of the apparatus electric signals of comparatively low amplitude are processed. In commercially available apparatuses it is known to shield the relevant parts of the apparatus from such spurious radiation by arranging the scanning unit inside a shielding enclosure and to accomodate the amplifier in a separate shielding box arranged adjacent the scanning unit on the chassis. A shielded cable is employed for the electrical connection between the sannning unit and the shielding box. Such a construction occupies a comparatively large space and is also relatively intricate as a result of requiring two separate shieldings. In addition, the cable which extends between the scanning unit and the amplifier is comparatively long and is therefore sensitive to spurious signals despite its shielding.

SUMMARY OF THE INVENTION

It is the object of the invention to shield the scanning unit and the amplifier by means of a construction which is as compact and simple as possible. In accordance with the invention, the shielding box for the amplifier and the shielding enclosure for the scanning unit of a VCR are therefore combined to form a constructional unit in which one wall of the shielding box and one wall of the shielding enclosure are formed by a common wall portion. In this way it is achieved that the two parts to be shielded, namely the scanning unit and the amplifier, are situated close to each other and the entire shielding for both parts is of a simple and cheap construction owing to the double use of one wall portion.

It is found to be very advantageous if the common wall portion is disposed near the free end wall of the scanning unit, which is remote from the chassis, and extends substantially parallel to said end wall of the scanning unit. In this way the generally used space bordering the free end wall of the scanning unit may be employed to accomodate the amplifier. This results in a very compact construction.

In this respect it is also found to be advantageous if the common wall portion is pivotably arranged on an adjoining wall of the shielding enclosure. In this way it is simple to gain access to the scanning unit, for example for adjustment operations during assembly of the apparatus, without the amplifier and its shielding forming an obstruction.

Moreover, it is found to be advantageous if an opening is formed in the common wall portion, opposite the scanning unit and centered on the scanning unit axis for the passage of at least the free end portion of the shaft by means of which the magnetic head can be rotated. An electrically conductive leaf spring is arranged on and is electrically connected to that side of the common wall portion which is remote from the scanning unit near the opening in this wall portion, the free end of the spring being in resilient contact with the free end of the shaft. This results in a very compact construction because the shielding can be situated in the direct vicinity of the free end wall of the scanning unit, while it is also possible to establish an additional electrically conductive connection with the scanning unit in order to preclude the occurrence of electrostatic charges in known manner.

For a simple construction it is also found to be advantageous if the amplifier is arranged on that side of the common wall portion which is remote from the scanning unit. The common wall portion is constructed as the bottom section of the shielding box for the amplifier, onto which the cover section can be mounted. In this way it is achieved that the amplifier is readily accessible.

Furthermore, it is found to be advantageous if a wall of the shielding enclosure, adjoining the common wall portion, is formed with a duct which extends substantially parallel to the scanning unit. The shielded cable connecting the magnetic head to the amplifier is passed through this duct. In this way an additional shielding for the shielded cable and hence a further reduction of its susceptibility to spurious radiation is obtained in a simple manner.

An embodiment of the invention will be described in more detail, by way of example, with reference to the accompanying drawing.

DESCRIPTION OF THE PREFERRED EMBODIMENT

Figure 1:
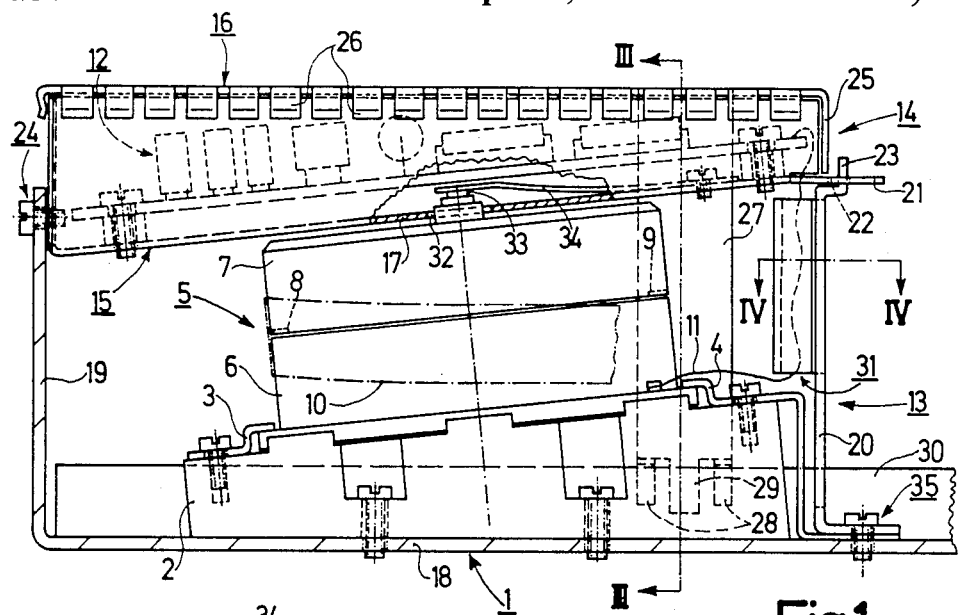
FIG. 1 is a partly sectional side view of a shielded scanning unit and a shielded amplifier of a recording and/or reproducing apparatus such as a VCR.

In FIG. 1 the reference numeral 1 denotes the chassis of a VCR made of an electrically conductive material. This chassis 1 carries a hollow cylindrical support 2, which is for example made of a plastics material. A cylindrical scanning unit 5, which is inclined relative to the chassis 1 in the customary manner, is secured to this support by means of brackets 3 and 4. This scanning unit 5 comprises a stationary drum section 6 and a coaxial rotatable drum section 7, between which drum sections a gap is formed, at the location of which gap for example two diametrically opposed magnetic heads 8 and 9 are arranged on the drum section 7. The motor for driving the drum section 7 may be accomodated in the stationary drum section 6 or may be secured to this drum section. A magnetisable record carrier 10 in the form of a tape can be wrapped along a helical path over at least a part of the circumferential surface of the scanning unit 5, as is indicated in dash-dot lines.

In known manner electric signals, for example video signals, can be recorded on or reproduced from the record carrier 10 in inclined tracks. For this purpose the magnetic heads 8 and 9 are connected to an amplifier 12 by a cable 11. The magnetic heads 8 and 9, the amplifier 12 as well as the cable 11 which extends between them are very sensitive to spurious radiation in the form of electromagnetic fields, because electric signals of comparatively low amplitude are processed in this electrical part of the apparatus. In order to shield the relevant parts of the apparatus from such spurious radiation the scanning unit 5 is provided with a shielding enclosure 13 and the amplifier 12 is accomodated in a shielding box 14. The shielded cable 11 extends through and between these two parts. The shielding box 14 comprises a tray-like bottom section 15 which can be closed by means of a detachable cover section 16.

In order to shield the scanning unit 5 and the amplifier 12 by means of compact and simple construction, the shielding box 14 for the amplifier 12 and the shielding enclosure 13 for the scanning unit 5 are combined to form a constructional unit in which one wall of the shielding box and one wall of the cuff-like shielding means are formed by a common wall portion. As can be seen in FIG. 1, the common wall portion in the present embodiment comprises the flat bottom wall 17 of the tray-like bottom section 15, which thus also constitutes the top wall of the shielding enclosure 13. The shielding box 14 is arranged near that free end wall of the scanning unit 5 which is remote from the chassis 1. The bottom wall 17 extends substantially parallel to the scanning unit end wall . This arrangement results in an effective use of the available space. To complete the shielding enclosure 13 the chassis 1 comprises an upright wall portion 19 extending from its base plate 18, and a separate wall 20 which extends substantially parallel to the wall 19, connected to the base plate 18 of the chassis 1. These walls 19 and 20 carry the shielding box 14. In this way the base plate 18 of the chassis 1, its upright wall portion 19, the bottom wall 17 of the shielding box 14 and the wall 20 surround the scanning unit 5 to form the shielding enclosure 13 for this unit.

Figure 2:
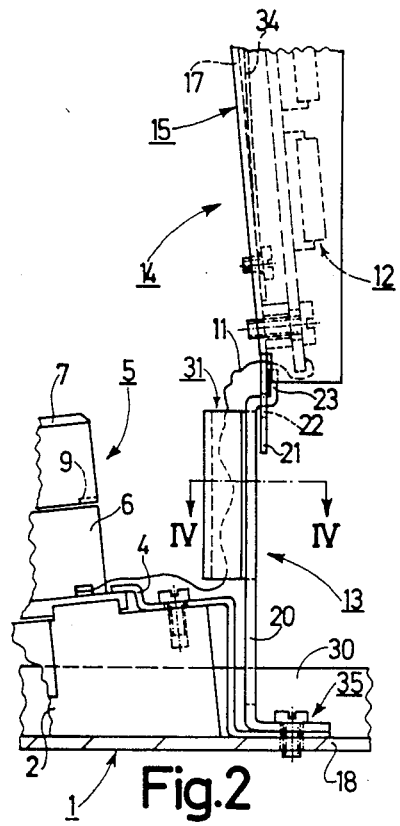
FIG. 2 shows a part of the scanning unit and the amplifier of FIG. 1, a part of the shielding being in the hinged-up position.

In this embodiment the shielding box 14 is connected to the walls 19 and 20 in such a way that the shielding box 14 can be pivoted up to gain access to the scanning unit 5, which is for example advantageous during assembly of the apparatus in view of adjustments to the scanning unit 5. For this purpose the bottom section 15 carries an outwardly projecting strip 21 near the wall 20, which is formed with a plurality of slits 22 which extend parallel to the wall 20, in line with one another. The wall 20 comprises bent tabs 23 which pass through. In this way the shielding box 14 or only its bottom section 15 can be tilted upwards as is shown in FIG. 2. If the shielding box 14 is swung down towards the scanning unit 5, it can be latched in this position. This may be effected, for example, by twisting the tabs 23 and a screw connection 24 between the wall 19 and the bottom section 15 of the shielding box 14. Obviously, such a hinged connection and latching can also be obtained by means of other known techniques.

Figure 3:
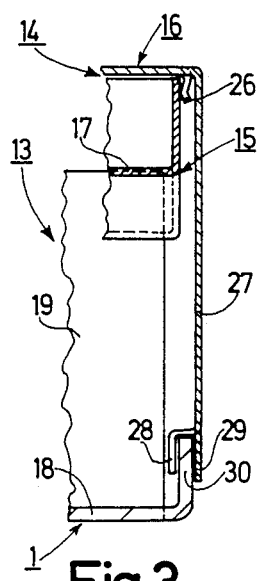
FIG. 3 is a sectional view taken on the line III—III in FIG. 1.

In order to ensure that the shielding box 14 is not open at the location where the strip 21 projects from the bottom section 15 the cover section 16 comprises a bent wall portion 25 to replace the missing side wall of the bottom section 15. The cover section 16 is detachable secured to the bottom section 15 in a customary manner by means of a series of tabs 26 which snap around the bottom section 15. In order to establish a connection between the cover section 16 and the chassis 1 this section comprises a limb 27 whose free end carries two bent tabs 28 and a straight tab 29 situated between them, which tabs alternately engage with different sides of an upright strip 30 on the base plate 18 of the chassis 1 (shown in FIG. 3). The amplifier 12 is arranged on that side of the common wall portion which is remote from the scanning unit 5, namely on the bottom wall 17 of the tray-shaped bottom section 15, so that it is readily accessible after removal of the cover section 16.

Figure 4:
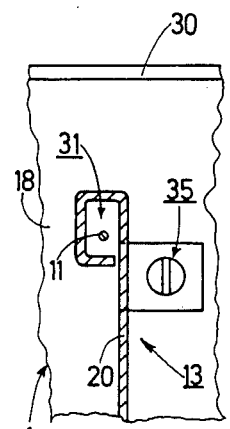
FIG. 4 is a sectional view taken on the line IV—IV in FIGS. 1 and 2.

As a result of such a double use of one wall portion for both shielding means it is also achieved that the two parts to be shielded, namely the scanning unit 5 and the amplifier 12, are situated close to each other. This not only has the advantage that the shielding means are of a simple construction but also that the electrical connection formed by the shielded cable 11 between the scanning unit 5 and the amplifier 12 can be very short, so that it is less susceptible to interference. For the same reason the wall 20 in the present embodiment is formed with a duct 31 which extends substantially parallel to the scanning unit 5, and through which the shielded cable 11 is led, so that it is additionally shielded from spurious radiation. As is apparent in particular from FIG. 4, such a duct 31 can be formed simply by several times bending a portion of the wall 20.

As is shown in FIG. 1, the common wall portion constituted by the bottom wall 17 is formed with an opening 32 which is situated opposite the scanning unit 5 and centered on the axis of this unit for the passage of the free end of a shaft 33 by means of which the drum section 7 carrying the magnetic heads 8 and 9 can be driven. Further, an electrically conductive leaf spring 34 is arranged on and is electrically connected to that side of the bottom section 17, constituting the common wall portion, which is remote from the scanning unit 5 near the opening 32 in said bottom section, the free end of this spring being in resilient contact with the free end of the shaft 33. This results in a very compact construction because the bottom wall 17 which constitutes the common wall portion can extend in the direct proximity of the free end wall of the scanning unit 5. Moreover, the conductive connection with the free end of the shaft 33 of the scanning unit 5 by means of the blade spring 34 can be obtained in a very simple and reliable manner. In known manner such a connection precludes the build-up of electrostatic charges on the rotatable drum section 7 of the scanning unit 5. In order to prevent the stationary drum section 6 of the scanning unit 5 from being charged electrostatically the bracket 4 which secures the scanning unit 5 to the support 2 is prolonged towards the chassis 1 and is secured to this chassis together with the wall 20 by means of a screw connection 35.

Obviously, a series of modifications to the above embodiments are possible within the scope of the invention. For example, instead of the wall 19 which is bent from the base plate 13 of the chassis 1, there may be provided a separate wall similar to the wall 20. Furthermore, the shielding box 14 may also be arranged adjacent the scanning unit 5, instead of the wall 19 or 20, in which case a separate top wall opposite the free end wall of the scanning unit 5 completes the shielding enclosure for the scanning unit 5. Moreover, the cover section 16 of the shielding box 14 may constitute the wall portion which is common to both shielding means, in which case the bottom section 15 accomodating the amplifier 12 is removable from the cover section 16. In this respect it is essential that the shielding box 14 for the amplifier 12 and the shielding enclosure 13 for the scanning unit 5 are combined to form a constructional unit in which one wall of the shielding box and one wall of the shielding enclosure are combined to form a common wall portion.

What is claimed is:

1. A recording and/or reproducing apparatus for a magnetizable tape record carrier, comprising an electrically conductive chassis; a cylindrical scanning unit arranged on said chassis, having a circumferential surface, and means for wrapping a length of said tape around said surface along a helical path; at least one rotatable magnetic head, forming part of said scanning unit and rotatable about an axis; an amplifier connected to said head by means including at least a shielded cable; an electrically conductive shielding box in which said amplifier is accommodated; and a shielding enclosure for said scanning unit, said enclosure being formed by said chassis and a plurality of electrically conductive walls arranged to be upright with respect to said chassis, characterized in that said shielding box and said shielding enclosure form a constructional unit having a common wall portion disposed between said scanning unit and said amplifier, and one of said electrically conductive walls is an adjoining wall, adjoining said common wall portion.

2. An apparatus as claimed in claim 1, characterized in that said scanning unit has a free end wall remote from the chassis, generally perpendicular to said axis, said common wall portion being disposed near said free end wall and extending substantially parallel to said end wall.

3. An apparatus as claimed in claim 2, characterized in that said common wall portion is pivotably arranged on said adjoining wall.

4. An apparatus as claimed in claim 3, characterized in that said common wall portion has an opening formed therein, centered on said axis; said scanning unit has a shaft by which the magnetic head is rotated, said shaft having a free end portion passing through said opening; and the apparatus comprises an electrically conductive leaf spring arranged on and electrically connected to a side of said common wall portion remote from the scanning unit, near said opening, said leaf spring having a free end in resilient contact with said shaft free end.

5. An apparatus as claimed in claim 4, characterized in that said amplifier is arranged on a side of said common wall portion remote from the scanning unit; and said shielding box has a bottom section and a removable cover section, said common wall portion being a portion of said bottom section.

6. An apparatus as claimed in claim 3, characterized in that said amplifier is arranged on a side of said common wall portion remote from the scanning unit; and said shielding box has a bottom section and a removable cover section, said common wall portion being a portion of said bottom section.

7. An apparatus as claimed in claim 2, characterized in that said amplifier is arranged on a side of said common wall portion remote from the scanning unit; and said shielding box has a bottom section and a removable cover section, said common wall portion being a portion of said bottom section.

8. An apparatus as claimed in claim 7, characterized in that said adjoining wall comprises a duct extending substantially parallel to said axis, said shielded cable being passed through said duct.

9. An apparatus as claimed in claim 6, characterized in that said adjoining wall comprises a duct extending substantially parallel to said axis, said shielded cable being passed through said duct.

10. An apparatus as claimed in claim 5, characterized in that said adjoining wall comprises a duct extending substantially parallel to said axis, said shielded cable being passed through said duct.

11. An apparatus as claimed in claim 4, characterized in that said adjoining wall comprises a duct extending substantially parallel to said axis, said shielded cable being passed through said duct.

12. An apparatus as claimed in claim 3, characterized in that said adjoining wall comprises a duct extending substantially parallel to said axis, said shielded cable being passed through said duct.

13. An apparatus as claimed in claim 2, characterized in that said adjoining wall comprises a duct extending substantially parallel to said axis, said shielded cable being passed through said duct.

14. A recording and/or reproducing apparatus for a magnetizable tape record carrier, comprising an electrically conductive chassis; a cylindrical scanning unit arranged on said chassis, having a circumferential surface, and means for wrapping a length of said tape round said surface along a helical path; at least one rotatable magnetic head, forming part of said scanning unit; an amplifier connected to said head by means including at least a shielded cable; an electrically conductive shielding box in which said amplifier is accommodated; and a shielding enclosure for said scanning unit, said enclosure being formed by said chassis and a plurality of electrically conductive walls arranged to be upright with respect to said chassis, and one of said electrically conductive walls is an adjoining wall, adjoining said common wall portion, characterized in that said scanning unit has a free end wall remote from the chassis, generally perpendicular to an axis of rotation of the scanning unit, said shielding box and said shielding enclosure form a constructional unit having a common wall portion disposed between said scanning unit and said amplifier, said common wall portion being disposed near said free end wall and extending substantially parallel to said end wall, and having an opening formed therein, centered on said axis, and said scanning unit has a shaft by which the magnetic head is rotated, said shaft having a free end portion passing through said opening; and the apparatus comprises an electrically conductive leaf spring arranged on and electrically connected to a side of said common wall portion remote from the scanning unit, near said opening, said leaf spring having a free end in resilient contact with said shaft free end.

15. An apparatus as claimed in claim 14, characterized in that said amplifier is arranged on a side of said common wall portion remote from the scanning unit; and said shielding box has a bottom section and a removable cover section, said common wall portion being a portion of said bottom section.

16. An apparatus as claimed in claim 15, characterized in that said adjoining wall comprises a duct extending substantially parallel to said axis, said shielded cable being passed through said duct.

17. An apparatus as claimed in claim 14, characterized in that said adjoining wall completes a duct extending substantially parallel to said axis, said shielded cable being passed through said duct.

18. An apparatus as claimed in claim 14, comprising means for pivotally connecting said common wall portion to said shielding enclosure, said means for pivoting comprising a plurality of slits arranged in line with one another, and a corresponding plurality of tabs passing through said slits.

19. An apparatus as claimed in claim 18, characterized in that said common wall portion has an outwardly extending strip in which said plurality of slits are formed, parallel to said adjoining wall; and said tabs are formed on said adjoining wall.

* * * * *

UNITED STATES PATENT AND TRADEMARK OFFICE
CERTIFICATE OF CORRECTION

PATENT NO. : 4,740,848
DATED : April 26, 1988
INVENTOR(S) : Josef Schild et al

It is certified that error appears in the above-identified patent and that said Letters Patent is hereby corrected as shown below:

IN THE CLAIMS

Claim 17, line 2     change "completes" to --comprises--

Signed and Sealed this

Eleventh Day of October, 1988

Attest:

DONALD J. QUIGG

*Attesting Officer*     *Commissioner of Patents and Trademarks*